United States Patent [19]

Obie et al.

[11] Patent Number: 5,038,096
[45] Date of Patent: Aug. 6, 1991

[54] SPECTRUM ANALYZER CIRCUIT FOR PULSED INPUT SIGNALS

[75] Inventors: Gene R. Obie; Timothy L. Hillstrom, both of Everett; Joseph F. Tarantino, Seattle; Richard A. Wilson, Everett, all of Wash.

[73] Assignee: Hewlett-Packard Company, Palo Alto, Calif.

[21] Appl. No.: 386,055

[22] Filed: Jul. 28, 1989

[51] Int. Cl.⁵ .............................................. G01R 23/16
[52] U.S. Cl. .................................................. 324/77 B
[58] Field of Search .............. 324/77 CS, 77 C, 77 B, 324/79 R, 79 D; 364/485, 486

[56] References Cited

U.S. PATENT DOCUMENTS 4,238,727 12/1980 Madni ................................. 324/77 B
4,839,583 6/1989 Takano et al. ..................... 324/77 B
4,896,102 1/1990 DuBois ............................... 324/77 B Primary Examiner—Hezron E. Williams
Assistant Examiner—Louis M. Arana

[57] ABSTRACT

A spectrum analyzer for measuring the frequency spectrum of a pulsed input signal includes a synthesized local oscillator for providing an oscillator signal. The local oscillator is responsive to a digital control input signal to sweep the frequency of the oscillator signal from a start frequency to a stop frequency wherein the values of the start and stop frequencies are determined by the control signal. The oscillator is further responsive to the control signal to stop sweeping the oscillator signal. The oscillator signal is mixed with the pulsed input signal and filtered to determine the peak voltage of a predetermined frequency component of the mixed input signal. A data processor is provided for providing the control signal to the local oscillator. The data processor is adapted to adjust the control signal so that the start frequency of the oscillator is equal to its previous stop frequency minus a predetermined frequency difference. The frequency difference is determined to compensate for the circuit delay of the spectrum analyzer and the sweep start-up transients of the local oscillator. The local oscillator is started at a time prior to the measurement interval so that at the beginning of the measurement interval the frequency of the local oscillator is equal to the stop frequency of the previous measurement interval.

17 Claims, 3 Drawing Sheets

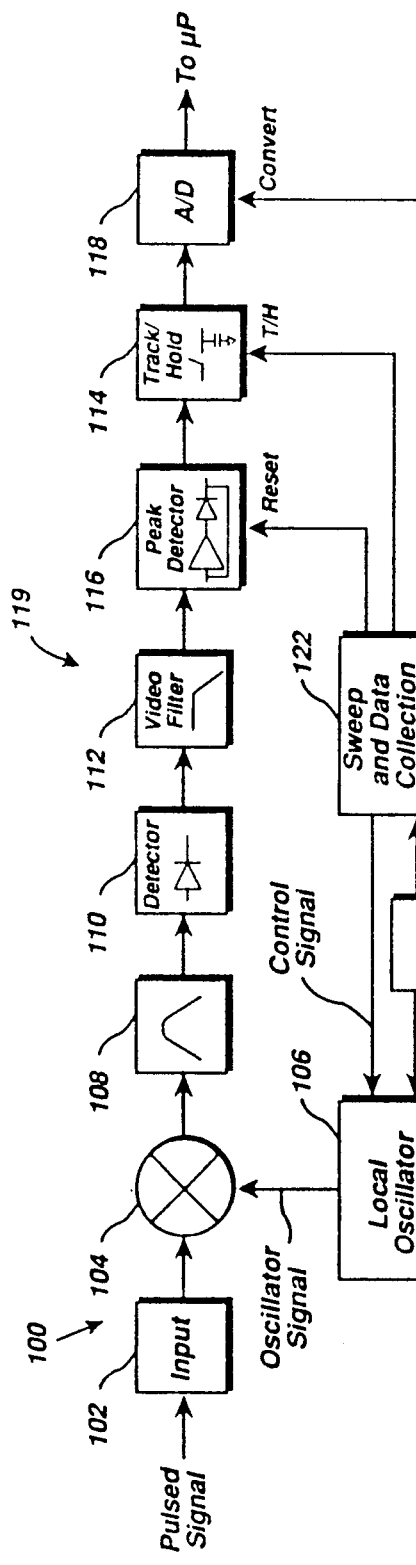
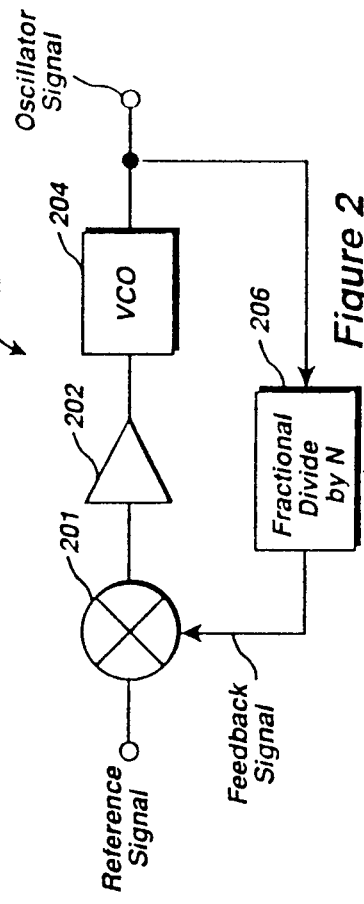
*Figure 1*
*Figure 2*

SPECTRUM ANALYZER CIRCUIT FOR PULSED INPUT SIGNALS

TECHNICAL FIELD

The present invention is directed toward spectrum analyzers and, more particularly, toward a method and apparatus for performing spectrum analysis on pulsed signals.

BACKGROUND OF THE INVENTION

Spectrum analyzers for determining the frequency spectrum of an input signal which is stationary in time have been available for several years. These frequency analyzers rely, however, upon the stationary nature of the input signal. Accordingly, they are unable to determine the frequency spectrum of or pulsed signals.

It is, however, often desirable to obtain the spectral components of a signal which has a pulsed nature. As used herein pulsed signals refer to signals which are not stationary in time wherein the input signal is characterized as having a plurality of active periods separated by inactive periods. Typically the pulsed signal is stationary during the active period. Devices which use pulsed signals include video cassette recorders (VCRs), disk drives, facsimile machines and multiplexers.

Prior art spectrum analyzers are incapable of measuring the frequency spectrum of pulsed signals due to the noncontinuous nature of the frequency of the pulsed signals. If an attempt is made to measure the active period of a pulsed signal with a prior art spectrum analyzer, the analyzer will detect the spectral components of both the active and inactive portions of the pulsed signal along with frequency components corresponding to the repetition rate of the pulsed signal. Measuring pulsed signals in this manner has several problems.

As an example, noise components or signals of interest may be buried under a frequency component present in the undesired inactive portion of the pulsed signal. In similar manner, noise components may be buried under one of the frequency components associated with the pulse repetition rate of the pulsed signal. If both the active and inactive portions of the pulsed signal contain a common frequency component, it is not possible to separate the contribution of this component to the frequency spectrum that is caused by the active portion of the pulsed signal from the contribution caused by the inactive portion of the pulsed signal. Analysis of the results can be confusing because of the presence of the frequency components associated with the pulse repetition rate. Analysis is further frustrated because the frequency components associated with the active and inactive portions of the pulsed signal appear to come and go at a time rate which is dependent on the sweep rate of the spectrum analyzer and the pulse repetition rate of the pulsed signal.

Others have attempted to modify prior art analyzers thereby to make them suitable for measuring pulsed signals. Such modifications have been implemented by sweeping the local oscillator of the spectrum analyzer only during the active portion of the signal using a trigger signal supplied by a sweep signal generation circuit external to the spectrum analyzer. Using such a modification and collecting and displaying data only during the time the local oscillator was sweeping would allow the spectrum of the pulsed signal to be analyzed without the effects of the frequency components produced by the inactive portions of the pulsed signal or the pulse repetition rate.

Such modifications to prior art spectrum analyzers have several disadvantages. One disadvantage is the need to generate timing signals in the sweep signal generation circuit external to the spectrum analyzer. A sweep signal generation circuit external to the analyzer must be used to generate a trigger signal that rises a first predetermined period of time after the rising edge of the active portion of the pulsed signal and falls a second predetermined period of time before the trailing edge of the active portion of the pulsed signal. Additionally, since the first predetermined time period is a function of the selected analyzer bandwidth, a means of selecting variable time would need to be provided if the analyzer were to be used with multiple bandwidth selections. Experience has shown that the timing signals are difficult to provide with the necessary accuracy.

A related disadvantage results from the desire to obtain as many conversions, i.e., data samples, as possible during the active portion of the pulsed signal. Such circuitry requires the trigger signal provided by the sweep signal generation circuit to anticipate, or predict, exactly when the active period of the pulsed signal will end so that no conversions are taken after the active period, i.e., during the inactive period. Failure to discontinue the trigger signal prior to the end of the active period of the pulsed signal will result in conversions of the pulsed signal being taken during the inactive period and corruption of the measurement, as discussed above.

A third disadvantage is the presence of spectral amplitude errors which occur during the portion of the pulsed signal that is frequency converted near the beginning and end of the measurement period. Using the above described modification to the prior art spectrum analyzers, the starting and stopping of the frequency sweep of the local oscillator creates a measurement period during which the pulsed signal is frequency converted and data is collected. Due to the nature of real versus ideal circuit components, amplitude errors are introduced in the frequency conversion at the beginning and end of the measurement interval. Such amplitude errors result from circuit propagation delays and oscillator transients when the data collection and sweeping of the local oscillator are performed synchronously. No known modification to prior art spectrum analyzers exists for compensating for such errors.

It is, therefore, desirable to provide a method and apparatus for measuring the frequency spectrum of a pulsed signal wherein the measurement is not affected by inactive portions of the pulsed signal. It is also desirable to provide a method and apparatus for measuring the spectral components of a pulsed signal wherein the measurement is not affected by frequency components due to the pulse repetition rate of the pulsed signal. It is further desirable to provide a method and apparatus for measuring the frequency components of a pulsed signal wherein the measuring apparatus and method is capable for compensating the measurement data for erroneous measurements taken during inactive portions of the pulsed signal. It is still further desirable to provide a method and apparatus for measuring the frequency spectrum of a pulsed signal wherein the measurement is not contaminated by amplitude errors occurring during the measurement.

SUMMARY OF THE INVENTION

In accordance with the present invention, a spectrum analyzer is provided for measuring the frequency spectrum of a pulsed signal. The spectrum analyzer includes a synthesized local oscillator for providing an oscillator signal. The local oscillator is responsive to a control signal to sweep the frequency of the oscillator signal from a start frequency to a stop frequency, wherein the values of the start and stop frequencies are established by the control signal. A mixer is provided for mixing the pulsed signal with the oscillator signal. A filter is coupled to the mixer to determine the peak voltage of a predetermined frequency component of the mixed pulsed signal wherein the peak voltage provides information regarding the spectrum of the pulsed signal. A data processor is provided for providing the control signal to the local oscillator. The data processor is adapted to establish the value of the control signal so that the start frequency of the local oscillator is equal to the stop frequency of the previous sweep minus a predetermined frequency difference.

In a first alternative embodiment of the invention, the data processor includes apparatus for controlling the filter to determine the peak voltage during a predetermined measurement period that occurs during active periods of the pulsed signal. The predetermined frequency difference is determined as a function of the sweep start-up transients of the local oscillator and the circuit delays of the filter. The data processor is further adapted to start the sweep of the oscillator signal at a time prior to the measurement period so that, at the beginning of the measurement period the frequency of the oscillator signal is equal to the stop frequency for the previous measurement period.

In a second alternative embodiment, the data processor includes apparatus for obtaining multiple samples of the peak voltage provided by the filter, the multiple samples being taken during the measurement period. The data processor is adapted to start the sweep of the oscillator signal before the beginning of the measurement period and to end the sweep of the oscillator signal after the end of the measurement period. The predetermined frequency difference is thereby a function of the sweep start-up transients of the local oscillator and the circuit delay of the filter. The data processor is further adapted to correct the stop frequency by an amount equal to the change in frequency of the oscillator signal between consecutive samples of the filter output. The data processor is further adapted to start the local oscillator sweep at a time prior to the measurement period so that at the beginning of the measurement period the frequency of the oscillator signal is equal to the corrected stop frequency.

BRIEF DESCRIPTION OF THE DRAWINGS

FIG. 1 is a functional block diagram of the spectrum analyzer the present invention.

FIG. 2 is a more detailed functional block diagram of the synthesized local oscillator illustrated in FIG. 1.

DETAILED DESCRIPTION OF THE INVENTION

Figure 3:
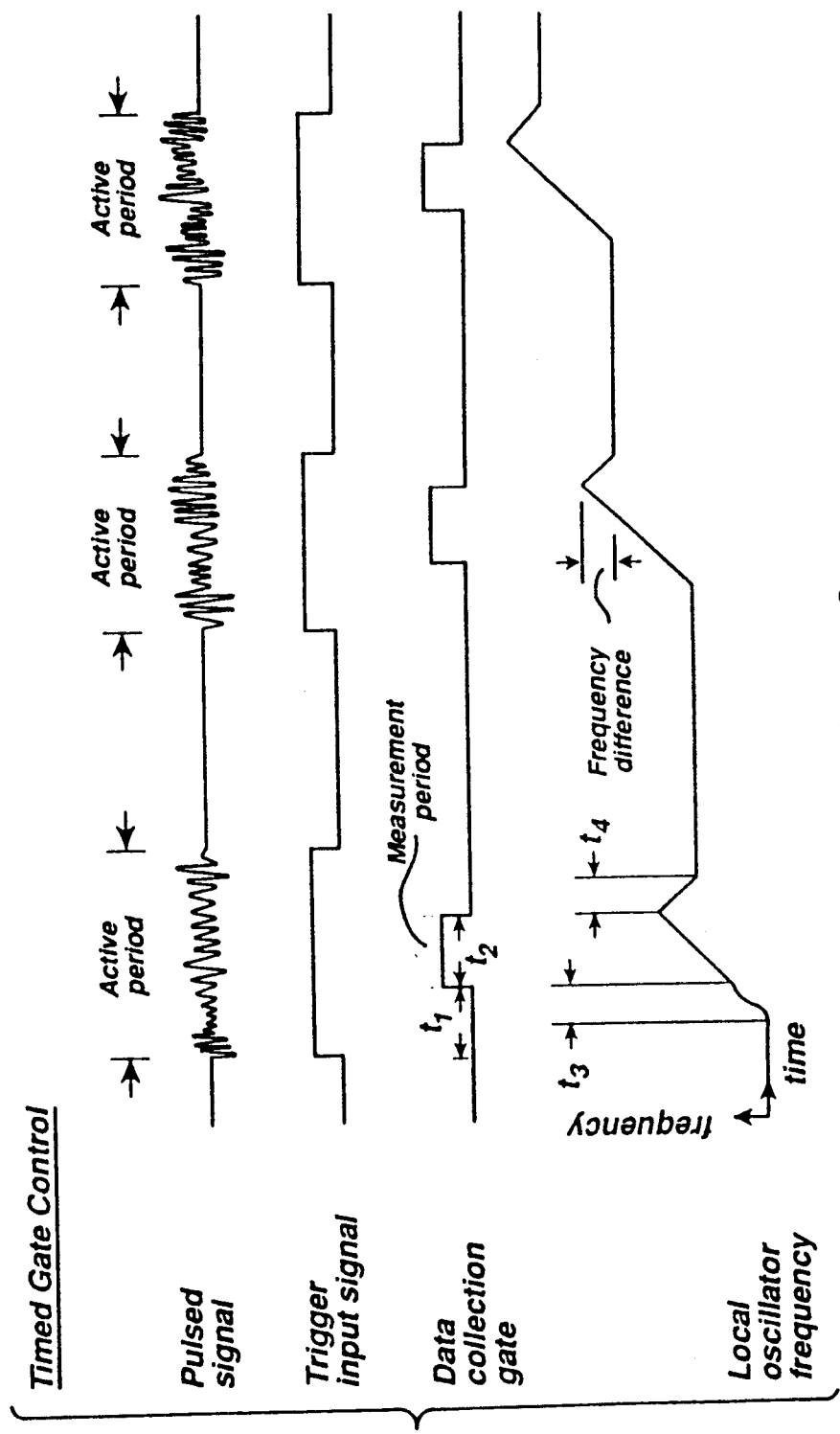
FIG. 3 is a timing chart illustrating the temporal relationship between several control signals of the spectrum analyzer of the present invention and the pulsed signal during a first mode of operation.
Figure 4:
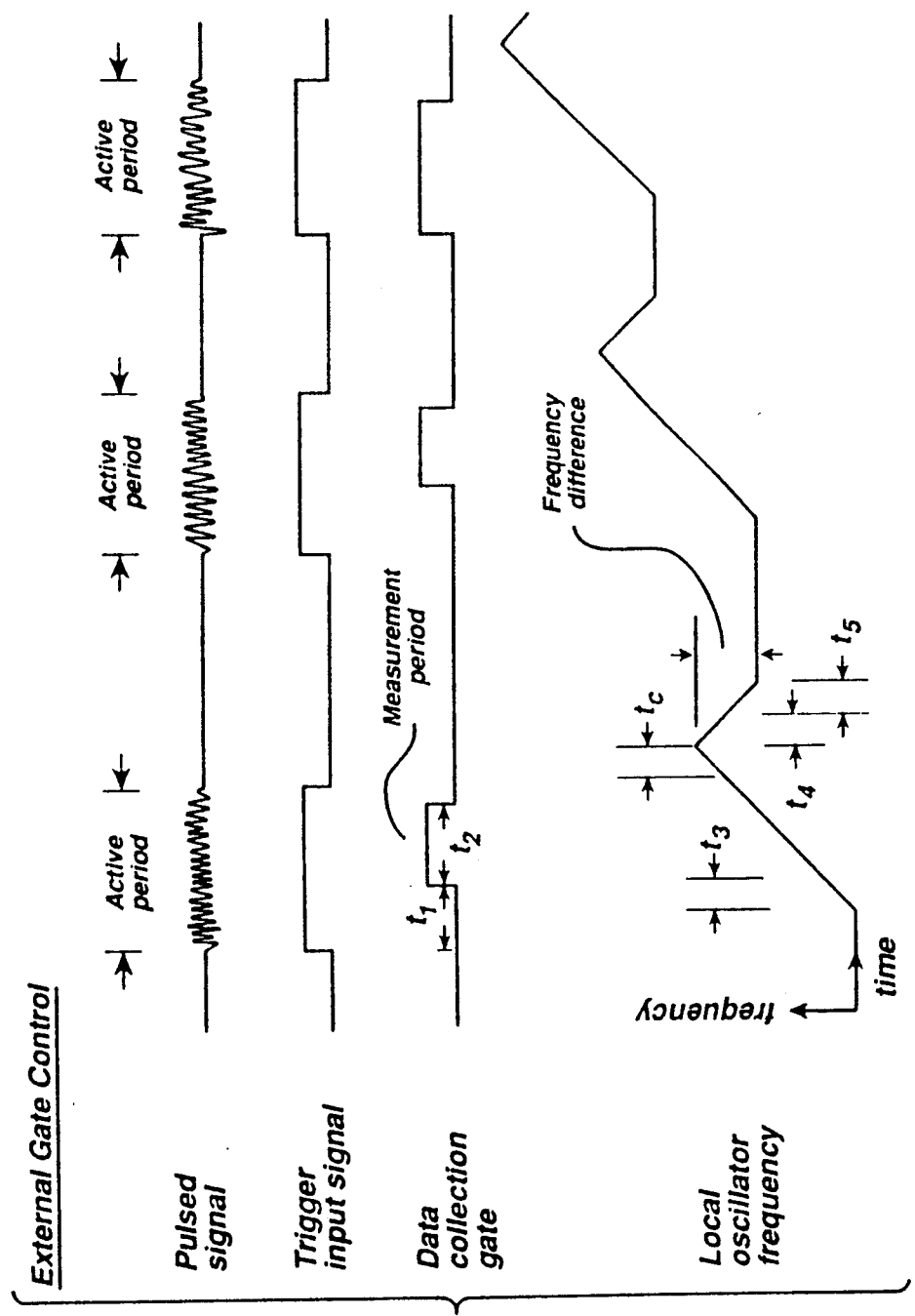
FIG. 4 is a timing chart illustrating the temporal relationship between several control signals of the spectrum analyzer of the present and the pulsed signal during a second mode of operation.

A spectrum analyzer 100 for determining the frequency spectrum of a pulsed signal is illustrated in FIG. 1. The pulsed signal for which the spectrum analyzer 100 is particularly suited is a signal having a noncontinuous frequency such as illustrated in FIGS. 3 and 4. The pulsed signal is characterized as having a plurality of active portions separated by inactive portions. While the subject invention is described by reference to a device that measures the frequency spectrum of the active portion of the pulsed signal, it will be apparent to those skilled in the art that the subject invention will be equally well suited for measuring the frequency spectrum of the inactive portion of the pulsed signal or for measuring the frequency spectrum of both the active and inactive portions of the pulsed signal. Further, although the subject invention is described by reference to pulsed signals, it will be apparent to those skilled in the art that the invention is equally well suited for measuring the frequency spectrum of continuous frequency input signals.

The spectrum analyzer 100 includes an input circuit 102 for receiving the pulsed signal input and for conditioning the input for use by the remainder of the circuit. The input circuit 102 may comprise conventional voltage amplifiers, filters, and other similar circuitry.

The output from the input circuit 102 is provided to a mixer 104 which is adapted to mix the conditioned pulsed signal input with an oscillator signal provided from a synthesized local oscillator 106. The mixer 104 may comprise any of several readily available double sideband mixers for mixing two input signals to provide a mixed output signal wherein the frequency spectrum of the output signal contains a plurality of frequency components equal to the sum and difference frequencies of the mixer input signals. The mixer 104 may also comprise a band pass filter for filtering the mixed output signal so that the output from the mixer 104 comprises only a single frequency component centered about a frequency equal to either the sum or the difference of the frequencies of the mixer input signals. As an alternative, mixer 104 may comprise any of several readily available single sideband mixers for providing an output signal having a frequency component equal to either the sum or difference frequency of its input signals.

The local oscillator 106 may comprise any of a variety of commonly available synthesized local oscillators that are responsive to a control signal for providing an oscillator signal wherein the frequency of the oscillator signal is determined by the value and/or magnitude of the control signal. In the presently preferred embodiment of the invention, the local oscillator 106 comprises a local oscillator of the type having a phase locked loop with digital, incremental feedback so that the frequency of the oscillator signal is controlled by a digital control signal. Further, the control signal provided to the local oscillator 106 includes a start frequency and a stop frequency and controls the local oscillator to sweep the frequency of the oscillator signal from the start frequency to the stop frequency. Still further, the control signal provided to the local oscillator 106 includes information to start the sweep of the oscillator signal at a specified time. The details of the preferred embodiment of the local oscillator 106 will be explained more fully below by reference to FIG. 2.

Returning to FIG. 1, the spectrum analyzer 100 further includes a resolution bandwidth filter 108 having a predetermined center frequency and a predetermined bandwidth, as is known in the art. The bandwidth filter 108 is coupled to receive and filter the mixed output signal from the mixer 104. As is known in the art, the energy of the output signal from the bandwidth filter 108 will be proportional to the magnitude of the frequency component of the filter input that has a frequency that is substantially equal to the center frequency of the bandwidth filter 108. Such filters may be readily constructed by those skilled in the art.

The output signal from the bandwidth filter 108 is coupled to an envelope detector 110 that is provided for detecting the energy level of the output signal from the bandwidth filter. The output signal of the envelope detector 110 is further filtered by a video filter 112 to remove noise signals that may be present therein. The output signal of the envelope detector 110 is provided to a track and hold capacitor 114 via a peak detector 116. The track and hold capacitor 114 and peak detector 116 are provided to cooperate with the video filter 112 and envelope detector 110 to detect the peak energy output from the bandwidth filter 108. The peak energy output from the bandwidth filter 108 is stored in the track and hold capacitor 114 in the form of a capacitor voltage.

The track and hold capacitor 114 is responsive to a hold signal for storing the capacitor voltage for later use by the spectrum analyzer circuit 100. The peak detector 116 is responsive to a reset signal to reset its output voltage thereby to allow another peak detection to occur. As will be described in more detail below, the hold and reset signals are timed to allow a number of peak detections to be taken and stored during the active portions of the pulsed signal.

The capacitor voltage output of the track and hold capacitor 114 is provided to an analog-to-digital converter 118. The analog-to-digital converter 118 is responsive to a convert signal for converting the analog capacitor voltage output of the track and hold capacitor 114 to a digital signal to be used by a system microprocessor 124. As is known in the art, the analog-to-digital converter 118 will provide a digital data word wherein the binary value of the digital data word is indicative of the magnitude of the capacitor voltage output from the track and hold capacitor 114. As is also known in the art, the values of a plurality of consecutive samples from the analog to digital converter 118 are used by the system microprocessor 124 to determine the frequency spectrum of the pulsed signal provided to the input circuit 102.

The input circuit 102, mixer 104, bandwidth filter 108, envelope detector 110, video filter 112, peak detector 116, track and hold capacitor 114 and analog to digital converter 118 may each comprise conventional devices found in prior art spectrum analyzers. Further, the bandwidth filter 108, envelope detector 110, video filter 112, peak detector 116 and track and hold capacitor 114 collectively comprise a sampling filter 119 for filtering the mixed output signal of the mixer 104 to determine the peak voltage of a predetermined frequency component of the mixed output signal. The predetermined frequency component being determined by the bandwidth of the bandwidth filter 108 and the frequency of the local oscillator 106, as is known in the art.

In accordance with the present invention, a trigger timing control circuit 120, a sweep and data collection controller 122 and the system microprocessor 124 (referred to collectively as a feedback processor circuit 126) cooperate to control the operation of the local oscillator 106 so that the spectrum analyzer 100 can provide accurate spectral analysis of the pulsed signal. Generally, the feedback processor circuit 126 controls the sampling filter 119 to take a plurality of samples during a measurement period, wherein the measurement period occurs during the active portion of the pulsed signal. The measurement period is illustrated by the "on time" of the data collection gate, i.e., time $t_2$, FIGS. 3 and 4.

The feedback processor circuit 126 controls the time that the oscillator signal provided by the local oscillator 106 begins to sweep so that the oscillator signal sweep is started at a time prior to the start of the measurement period. Further, the feedback processor circuit 126 controls the start frequency of the oscillator signal sweep so that at the beginning of the measurement period the frequency of the oscillator signal is equal to the stop frequency of the oscillator signal at the conclusion of the previous measurement period. As illustrated in FIGS. 3 and 4, this is accomplished by starting the local oscillator 106 at a start frequency that is less than the previous measurement period stop frequency and allowing the oscillator signal frequency to ramp up to the stop frequency prior to the current measurement period. The time $t_3$ necessary for the ramping is computed by the feedback processor circuit 126 and the local oscillator 106 is started so that the oscillator signal will reach the stop frequency of the previous measurement period at the beginning of the current measurement period.

Since the local oscillator 106 is started prior to the measurement period, circuit delays causing amplitude errors are minimized thereby drastically improving the integrity of the spectral measurement. Further, transients in the oscillator signal that occur at the beginning of the sweep and which further add to amplitude errors are allowed to stabilize before any samples are taken, further improving the integrity of the measurement.

As will be described in more detail below, the feedback processor circuit 126 operates in a first and second mode illustrated by the timing signals of FIGS. 3 and 4, respectively. The first mode may be referred to as the timed gate mode meaning that the length of the measurement period is controlled by the operator of the spectrum analyzer 100. In this mode the operator actually provides two time periods to the spectrum analyzer 100, one to determine the length of time after the beginning of the active portion of the pulsed signal that the measurement period is to begin and one to determine the length of the measurement period. The sum of the two time periods must be less that the length of the active portion of the pulsed signal to maintain the integrity of the resultant measurement.

In the second mode, referred to as the external gate control mode, the user simply provides a trigger signal having a time period equal to the duration of time following the beginning of the active portion of the pulsed signal that the measurement period is to begin. The feedback processor circuit 126 controls the local oscillator 106 and sampling filter 119 to take as many samples as possible from the beginning of the measurement period until the end of the active portion of the pulsed signal. In both the first and second modes the start time and frequency of the local oscillator 106 is controlled to eliminate amplitude errors caused by circuit delays and oscillator transients, as described above. In the second mode the starting time of the local oscillator 106 is further controlled to compensate for erroneous measurements that may be taken after the active portion of the pulsed signal.

With reference to FIG. 1, the operation of the feedback processor circuit 126 will be described in more detail. The trigger timing control circuit 120 comprises a plurality of digital control circuits for providing timing signals in response to a trigger input signal provided by a user of the spectrum analyzer 100. As illustrated in FIG. 3, the trigger input signal is indicative of the active portion of the pulsed signal. The trigger timing control circuit 120 is responsive to the trigger input signal to provide a data collection gate signal characterized by a first period $t_1$ that is indicative of the delay between the beginning of the active portion of the pulsed signal and the measurement period and a second period $t_2$ that is indicative of the duration of the measurement period.

As described above, in the first mode of operation the duration of the second period $t_2$ is predetermined by the user of the spectrum analyzer 100. In this mode, the user will select a time period so that the sum of the duration of the time periods $t_1$ and $t_2$ is less than the duration of the trigger input signal thereby to ensure that the measurement period does not extend beyond the active portion of the pulsed signal. The trigger timing control circuit 120 is further operable in a second mode to activate the data collection gate signal after the first period $t_1$ following activation of the trigger signal and to inactivate the data and collection gate signal immediately on or before inactivation of the trigger signal. However, in this mode instead of selecting the duration of both the first and second time periods $t_1$ and $t_2$, the user selects only the duration of the first time period $t_1$ thereby indicating when the measurement period is to begin. The end of the measurement period is determined by the end of the trigger input signal provided by the user.

The sweep and data collection controller 122 is responsive to the data collection gate signal provided by trigger timing control circuit 120 to provide the reset, hold and convert signals, discussed above. In the first mode of operation, the sweep and data collection controller 122 is operable to provide the convert signal to the analog to digital converter 118 at predetermined intervals during the measurement period such that no convert signals are provided after the measurement period. In this mode, the user provides input to determine how many samples of the capacitor voltage output from the track and hold capacitor 114 are to be taken during the measurement period. As mentioned above, each sample provides information relative to the frequency spectrum of the pulsed signal.

The sweep and data collection controller 122 is operable in the second mode to provide the convert signal at predetermined intervals during the measurement period and to provide a final convert signal following inactivation of the trigger signal provided by the user. In this mode, the user selects a time period between samplings of the track and hold capacitor 114. The sweep and data collection controller 122 takes as many samples as can be taken during the measurement period, taking a final sample after the trigger input signal indicates that the active portion of the pulsed signal has ended, i.e., that the pulsed signal has commenced the next inactive portion.

In both the first and second modes, the sweep and data collection controller 122 provides the reset and hold signals at substantially the same time that the convert signal is provided. More particularly, the hold and reset signals are provided just prior to providing the convert signal. All three signals are removed at substantially the same time (although the reset signal may be removed slightly before or after the convert and hold signals are removed).

It will be apparent to those skilled in the art that in both the first and second modes, amplitude errors will be introduced in the spectral analysis as a result of starting and stopping the oscillator signal sweep. As an example, due to the circuit delays of the resolution bandwidth filter 108 and video filter 112, the amplitudes of the filter output signals are not stabilized immediately after the oscillator signal begins to sweep. Also, since the local oscillator 106 has associated with its circuitry transients that occur at the beginning of a sweep, the oscillator signal introduces amplitude errors into the spectral measurement that are not deterministic immediately after the local oscillator 106 is started. Accordingly, a correction is necessary to enhance the integrity of the measurement provided by the spectrum analyzer 100.

In accordance with the present invention, the error correction is provided by the system microprocessor 124 acting in conjunction with the trigger timing control circuit 120, the sweep and data collection controller 122 and the local oscillator 106. The sweep and data collection controller 122 controls the operation of the local oscillator 106 by providing the control signal thereto. More particularly, the sweep and data collection controller 122 controls both the time and the frequency at which the oscillator signal begins to sweep. The sweep and data collection controller 122 also records the stop frequency at which the control signal instructs the local oscillator 106 to stop the oscillator signal sweep.

In the first mode of operation, the sweep and data collection controller 122 is operable to provide the control signal so that the oscillator signal produced by the local oscillator 106 will have a frequency that is less than the stop frequency of the oscillator signal at the conclusion of the prior measurement period, the differences in frequencies being equal to a first predetermined frequency difference, as illustrated in FIG. 3.

The first predetermined frequency difference is determined by the circuit delays of the spectrum analyzer 100 and the sweep transient time of the local oscillator 106. Accordingly, the oscillator signal sweep is started at a frequency and a time $t_3$ prior to the measurement period so that at the beginning of the measurement period the frequency of the oscillator signal will be equal to the stop frequency of the oscillator signal at the termination of the previous measurement period. Since the oscillator signal will have propagated through the spectrum analyzer 100, the effects of amplitude errors due to circuit delays are minimized. Also, transients in the oscillator signal will have stabilized, further minimizing the effects of amplitude errors on the measurement. Similarly, the oscillator signal is swept down a period of time $t_4$ at the end of the measurement period so that the oscillator will have a frequency equal to the stop frequency of the oscillator signal at the conclusion of the measurement period less the first predetermined frequency difference. Those skilled in the art will recognize that if the down sweep rate is equal to the up sweep rate, then the time $t_4$ will equal the time $t_3$.

The sweep and data collection controller 122 is further operable in the second mode to provide the control signal to the local oscillator 106 in a manner to result in the oscillator signal having a frequency that is less than the stop frequency of the oscillator signal at the conclusion of the previous measurement period, the difference in frequencies being equal to a second predetermined frequency difference, as illustrated in FIG. 4. The second predetermined frequency difference is determined in part by the circuit delays of the spectrum analyzer 100 and the sweep transient time of the local oscillator 106, as described above by reference to FIG. 3. In addition, to the compensation discussed with respect to the first predetermined frequency difference and the time period $t_4$ the stop frequency of the previous measurement period is compensated by subtracting the time interval between consecutive convert signals so that the frequency of the oscillator signal at the beginning of the next measurement period will be equal to the frequency of the oscillator signal at the time the last valid sample was taken.

As noted above, in the second mode of operation the sweep and data collection controller provides an additional convert signal after the conclusion of the active portion of the pulsed signal. The additional compensation due to the time interval between active convert signals makes the realization that the final conversion that results from the additional convert signal provides, at least in part, a response due to the unwanted frequency spectrum of the inactive portion of the pulsed signal. The corresponding data sample from the analog to digital converter 118 provided to the system microprocessor 124 contains invalid data and is therefore discarded. The stop frequency of the oscillator signal is corrected for the duration of time $t_c$ between convert signals thereby to provide an oscillator signal stop frequency equal to the frequency of the local oscillator 106 at the previous convert signal. The second predetermined frequency difference therefore includes, in addition to the first predetermined frequency difference, the difference in frequency of the oscillator signal between the discarded data point and the last valid data point. Accordingly, at the conclusion of a measurement, the frequency of the oscillator signal is swept down for a time $t_4$, as discussed above, and an additional time $t_5$ necessary to provide the frequency correction for the unwanted frequency sweep increase, discussed above by reference to the time $t_c$. Those skilled in the art will recognize that if the down sweep rate is equal to the up sweep rate, then the time $t_5$ will equal the time $t_c$. In this manner, the integrity of the measurement is maintained.

The trigger timing control circuit 120 and the sweep and data collection controller 122 may comprise any of a variety of devices readily available to those skilled in the art. Alternatively, a combination of conventional digital devices may be combined to perform the functions described herein with respect to the trigger timing control circuit 120 and the sweep and data collection controller 122. Similarly, those skilled in the art will be able to provide all necessary circuitry to combine the trigger timing control circuit 120 and the sweep and data collection controller 122 with the system microprocessor 124, including integration into the circuit of any necessary interface devices, such as buffers and filters, and/or any necessary peripheral devices, such as memory, timers, latches or multiplexers. Alternatively, the feedback processor circuit 126 may be implemented using any conventional processing circuitry.

A method and apparatus has been described that is capable of performing accurate spectrum analyses on pulsed signals. The method and apparatus relies in large measure upon the ability to provide a local oscillator 106 wherein the start frequency of the oscillator signal sweep may be accurately established in a controllable fashion. As mentioned above, the presently preferred local oscillator 106 comprises a local oscillator of the synthesized version wherein the output frequency of the local oscillator is a function of the digital value of a control signal. Such a local oscillator is illustrated in FIG. 2.

With respect to FIG. 2, the preferred embodiment of the local oscillator 106 is illustrated. The local oscillator 106 comprises a phase locked loop 200 that includes a phase detector 201 for comparing the phase of a substantially fixed frequency reference signal input to that of a feedback signal. As is known in the art, the reference signal may comprise a plurality of constant frequency reference signals such as, for example, a one-kilohertz signal, a two-kilohertz signal and a five-kilohertz signal that are multiplexed to the input of the phase detector 201.

The output signal from the phase detector 201 is filtered by a filter 202 and provided to a voltage-controlled oscillator 204. The filter 202 is adapted to provide a substantially direct current signal that is indicative of the energy from the phase detector 201. The voltage-controlled oscillator 204 comprises a conventional device that is responsive to the magnitude of the output of the filter 202 to alter the frequency of the oscillator signal. The output signal of the voltage controlled oscillator 204 may be filtered and amplified as needed and provided as the oscillator signal of the local oscillator 106.

The output signal of the voltage-controlled oscillator 204 is also provided to a fractional divide by N counter 206 which receives the control signal from the system microprocessor 124 (see FIG. 1). In the presently preferred embodiment of the invention, the counter 206 is responsive to a digital control word to divide the output frequency of the voltage-controlled oscillator 204 by a factor N, which factor is specified by the digital value of the control signal and which factor may comprise a non-integer. The output signal of the counter 206 comprises the feedback signal provided to the phase detector 201. As is known in the art, the phase lock loop 200 is stable when the output signal from the voltage-controlled oscillator 204 is equal to the frequency of the reference signal multiplied by the value N specified by the digital control signal.

The embodiment of the local oscillator illustrated in FIG. 2 may be provided as a conventional device or may be readily implemented by those skilled in the art. Further, other synthesized local oscillator circuits may be used instead of the presently preferred digital, incremental feedback type described herein. As mentioned above, the only limiting requirement on the choice of the local oscillator 106 is the need to be controllable in start time and frequency so that the compensation that comprises the present invention may be implemented.

While only several presently preferred embodiments of the spectrum analyzer of the present invention have been described in detail herein, modifications and variations will readily become apparent to those skilled in the art. The intention, therefore, is not to be limited except by the claims appended hereto, which are intended to encompass all such modifications and variations as fall within the true scope and spirit of the invention.

We claim:

1. A spectrum analyzer for measuring the frequency spectrum of a pulsed signal having an active portion and an inactive portion wherein a user provided trigger signal is active during the active portion of the pulsed signal, said analyzer comprising:

input means for receiving the input signal and for conditioning the input signal to produce a conditioned output signal;

oscillator means for producing a synthesized local oscillator signal, said oscillator means including a phase locked-loop having digital, incremental feedback with the frequency of said oscillator signal controlled by a digital control signal, said oscillator means being further responsive to said control signal to sweep the frequency of said oscillator signal from a start frequency to a stop frequency wherein the value of the stop and start frequencies are provided by said control signal;

mixer means for combining said conditioned output signal from said input means and said oscillator signal from said oscillator means to produce a mixed signal having a frequency component that is the difference of the frequencies of said conditioned output signal and said oscillator signal;

first filter means for filtering said mixed signal from said mixer means to produce a first filter output signal with the energy of said first filter output signal being maximized only when the frequency of said mixed signal is within a predetermined frequency range;

first detector means for detecting the envelope of said first filter output from said first filter means to produce a first detector output signal;

second filter means for filtering said first filter signal from said first detector means to produce a second filter output signal with noise signals that may be present therein removed;

second detector means for detecting the peak voltage amplitude of said second filter output signal from said second filter means to produce detected peak voltages of said second filter output signal, said second detector means being responsive to a reset signal with the peak voltage amplitude being detected between occurrences of said reset signal;

storage means for tracking and storing said peak voltage detected by said second detector means, said storage means being responsive to a hold signal for storing, in analog form, said detected peak voltage for at least an interval of time between occurrences of said reset signal;

conversion means for converting the analog form of said peak voltage stored by said storage means to a digital output signal with the digital value of said digital output signal corresponding to the magnitude of said peak voltage stored by said storage means, said conversion means being responsive to a convert signal for making the conversion to said digital output signal, said digital output signal comprising the output signal of the spectrum analyzer;

timing means for producing first and second timing signals in response to the trigger signal received from the user, said first timing signal indicating the time delay between the beginning of the active portion of the input signal and a measurement period during which the frequency spectrum is determined, said second timing signal representing the duration of said measurement period, said timing means operating in a first mode and second mode, when in said first mode said timing means producing said second timing signal a first predetermined time period after the beginning of the trigger signal, said first predetermined time period being selected by the user, and when in said second mode said timing means producing said second timing signal to commence after said first predetermined time period following commencement of the trigger signal and to terminate on or before termination of the trigger signal;

controller means for producing said reset, hold and convert signals, said controller means operating in a first mode and a second mode, when in said first mode said controller means producing said convert signal at predetermined intervals during an active portion of second timing signal such that no convert signals are produced after an active portion of said second timing signal, and when in said second mode said controller means producing said convert signal at predetermined intervals during an active portion of said second timing signal and a final convert signal following transition from said active portion to said inactive portion of said second timing signal, said controller means operating in said first and second modes for producing said reset and hold signals at substantially the same time as said convert signal;

data processor means for providing said control signal to said oscillator means to cause said oscillator means to produce said oscillator signal with a start frequency that is less than a desired start frequency for said oscillator signal, the difference in frequencies being determined by the circuit delays of the spectrum analyzer and the start-up sweep transient time of said oscillator means, said data processor means operating in a first mode and a second mode, when in said first mode said data processor means establishing a desired start frequency equal to a stop frequency existing at the conclusion of the prior measurement period, and when in said second mode said data processor means establishing said desired start frequency equal to said stop frequency at the conclusion of the prior measurement period corrected by an amount equal to the change in frequency of said oscillator signal between consecutive occurrences of said convert signal, said data processor means being responsive to the trigger signal for providing said control signal to said oscillator means to begin sweep of said oscillator signal prior to the beginning of the next measurement period so that at the beginning of the next measurement period the frequency of said oscillator signal will be equal to said desired start frequency.

2. A spectrum analyzer for measuring the frequency spectrum of a pulsed input signal comprising:

oscillator means for producing an oscillator signal, said oscillator means being responsive to a control input signal to sweep the frequency of said oscillator signal from a start frequency to a stop frequency wherein the values of the start and stop frequencies are determined by said control signal;

means for mixing the input signal with said oscillator signal;

filter means for filtering said mixed input signal to determine the peak voltage of a predetermined frequency component of said mixed input signal, the peak voltage providing information regarding the frequency spectrum measurement of the input signal; and data processor means for producing said control signal, said data processor means being adapted to establish the value of said control signal so that the start frequency at which said oscillator signal begins to sweep is equal to a desired start frequency minus a predetermined frequency difference thereby to correct for circuit delays in said mixer means and said filter means and to correct for sweep start-up transients in said oscillator means.

3. The spectrum analyzer as recited in claim 2 wherein the input signal is characterized by having active portions separated by inactive portions, and wherein said data processor means comprises means for producing said control signal so that said oscillator signal is swept during a predetermined measurement period occurring during active portions of the input signal, said data processor means being further adapted to establish the desired start frequency to equal the stop frequency of the previous measurement period and to produce said control signal to start said oscillator signal sweep at a time prior to the beginning of the next measurement period so that at the beginning of the next measurement period the frequency of said oscillator signal is equal to the desired start frequency.

4. The spectrum analyzer as recited in claim 2 wherein the input signal is characterized by having active portions separated by inactive portions and wherein said data processor means comprises data collection means for obtaining multiple samples of the peak voltage produced by said filtering means, said data processor means being adapted to produce said control signal so that said oscillator signal is swept during a predetermined measurement period occurring during active portions of the input signal and so that said oscillator signal sweep is ended prior to the end of the active portion of the input signal, said data processor means being adapted to establish the desired start frequency to equal the stop frequency of the previous measurement period corrected by an amount equal to the frequency change of said oscillator signal between consecutive samples of said filter means output, said data processor means being further adapted to produce said control signal to start said oscillator signal sweep at a time prior to the beginning of the next measurement period so that at the beginning of the next measurement period the frequency of said oscillator signal is equal to the desired start frequency.

5. The spectrum analyzer as recited in claim 2 wherein said data processor means further comprises data collection means for obtaining multiple samples of the peak voltage produced by said filtering means, said data processor means operating in a first mode to produce said control signal so that said oscillator signal is swept during a predetermined measurement period occurring during active portions of the input signal, said data processor means operating in a second mode to produce said control signal so that the sweep of said oscillator signal is ended prior to the end of the active portion of the input signal, said data processor means operating in the first mode to establish the desired start frequency to equal the stop frequency of the previous measurement period, said data processor means operating in the second mode to establish the desired start frequency to equal the stop frequency at the end of the previous measurement period corrected by an amount equal to the change in frequency of said oscillator signal between consecutive samples of the filter output, said data processor means operating in both modes to produce said control signal to start the sweep of said oscillator signal at a time prior to the beginning of the next measurement period so that at the beginning of the next measurement period the frequency of said oscillator signal is equal to the desired start frequency.

6. The spectrum analyzer as recited in claim 5 further comprising means for receiving a trigger input from a user wherein the trigger input is indicative of the active and inactive portions of the input signal, said data processor means being responsive to the trigger signal input to produce said control signal.

7. The spectrum analyzer as recited in claim 2 wherein said oscillator means comprises:
mixer means for mixing a substantially fixed frequency reference signal with a feedback signal;
voltage controlled oscillator means responsive to the output of said mixer means for producing said oscillator signal output of said oscillator means wherein the frequency of said oscillator signal is a function of the voltage magnitude of the output of said mixer means; and
division means for dividing the frequency of said oscillator signal by a predetermined factor to produce said feedback signal wherein the predetermined factor is controlled by said control signal received from said data processor means.

8. The spectrum analyzer as recited in claim 7 wherein said division means further comprises means for dividing said oscillator signal by a fractional factor.

9. The spectrum analyzer as recited in claim 2 further comprising means for converting the output from said filter means to a digital output and for storing the digital output to determine the frequency of said oscillator signal at the time that the maximum filter means output is produced.

10. A spectrum analyzer for measuring the spectrum of a pulsed input signal comprising:
sampling filter means for mixing the pulsed input signal with an oscillator signal and filtering said mixed input signal to produce a plurality of data samples indicative of the frequency spectrum of the pulsed input signal, said sampling filter means being responsive to a sample control signal for producing the plurality of data samples during a measurement period;
feedback processor means, responsive to a trigger signal produced by a user of the spectrum analyzer, for producing said sample control signal, said feedback processor means operating in a first mode to produce said sample control signal in a manner so that no data samples are taken during the inactive portion of the pulsed input signal, said feedback processor means operating in a second mode to produce said sample control signal so that one data sample is taken following each measurement period; and
local oscillator means for producing said oscillator signal, said local oscillator means being responsive to a control signal received from said feedback processor means to sweep the frequency of said oscillator signal from a start frequency to a stop frequency wherein the values of the start and stop frequencies are determined by said control signal, said feedback processor means being further operable to select the start frequency at which said oscillator signal will begin to sweep to be a frequency equal to a desired start frequency minus a predetermined frequency difference wherein the predetermined frequency difference is determined by the circuit delay of the sampling filter and the sweep start-up transients of said local oscillator means, said feedback processor means operating to start said oscillator signal sweep at a time prior to the beginning of the next measurement period so that at the beginning of the next measurement period the frequency of said oscillator signal is equal to the desired start frequency, said feedback processor means operating in the first mode to select the desired start frequency to equal the stop frequency of the previous measurement period and operable in the second mode to select the desired start frequency to equal the stop frequency of the previous measurement period minus the increase in frequency of said oscillator signal between consecutive occurrences of said sample control signal.

11. The spectrum analyzer as recited in claim 10 wherein said local oscillator means further comprises:
   mixer means for mixing a substantially fixed frequency reference signal with a feedback signal;
   voltage controlled oscillator means responsive to the output of said mixer means for producing said oscillator signal output of said oscillator means wherein the frequency of said oscillator signal is a function of the voltage magnitude of the output of said mixer means; and
   division means for dividing the frequency of said oscillator signal by a predetermined factor to produce said feedback signal wherein the predetermined factor is controlled by said control signal received from said data processor means.

12. The spectrum analyzer as recited in claim 11 wherein said feedback processor means comprises a microprocessor.

13. A method for determining the spectrum of an input signal wherein the input signal is characterized by active portions separated in time by inactive portions, said method comprising the steps of:
   (a) sweeping the frequency of an oscillator signal from a start frequency to a stop frequency;
   (b) mixing the input signal with the oscillator signal;
   (c) filtering the mixed input signal to determine the peak voltage of a predetermined frequency component of the mixed input signal, the peak voltage providing information regarding the spectrum of the input signal;
   (d) stopping the oscillator signal at a predetermined time and recording the stop frequency of the oscillator signal; and
   (e) establishing the start frequency of the oscillator signal as the stop frequency minus a predetermined frequency difference.

14. The method as recited in claim 13 further comprising the step of taking multiple peak voltage samples of the predetermined frequency component during a predetermined measurement period occurring during an active portion of the input signal wherein step (d) further comprises the substep of stopping the oscillator signal sweep after elapse of a predetermined time interval and wherein step (e) further comprises the substep of determining the predetermined frequency difference to be a function of the sweep transient start-up time of the oscillator signal and the delay time for the mixing and filtering steps, the step (a) further comprising the substep of starting the oscillator signal sweep at a time prior to the occurrence of the measurement period so that at the beginning of the measurement time period the frequency of the oscillator signal is equal to the stop frequency of the previous measurement period.

15. The method as recited in claim 13 further comprising the step of taking multiple peak voltage samples of the predetermined frequency component during a measurement period occurring during an active portion of the input signal and wherein step (d) comprises the substep of stopping the oscillator signal sweep after the active portion of the input signal and wherein step (e) comprises the substep of determining the predetermined frequency difference to be a function of the sweep transient start-up time of the oscillator signal and the delay time of the filtering and mixing steps, the step (a) further comprising the substep of starting the oscillator signal sweep at a time prior to the occurrence of the measurement period so that at the beginning of the measurement period the frequency of the oscillator signal is equal to the stop frequency for the previous measurement period minus the change in frequency of the oscillator signal between consecutive samples of the peak voltage of the predetermined frequency component.

16. The method as recited in claim 13 further comprising the step of providing a synthesized oscillator signal.

17. The method as recited in claim 16 wherein the step of providing a synthesized oscillator signal further comprises the substeps of:
   (f) providing a substantially constant frequency reference signal;
   (g) mixing the reference signal with a feedback signal in a manner to produce a substantially direct current voltage having a magnitude that is substantially constant when the frequency of the feedback signal is equal to the frequency of the reference signal;
   (h) dividing frequency of the oscillator signal by a controllable constant to produce the feedback signal; and
   (i) varying the oscillator signal frequency in response to variations in the magnitude of the direct current voltage so that the frequency of the feedback signal is equal to the frequency of the reference signal and so that the oscillator signal is a multiple of the reference signal wherein the multiple is equal to the controllable constant.

* * * * *